(12) United States Patent
Park et al.

(10) Patent No.: US 8,466,738 B2
(45) Date of Patent: Jun. 18, 2013

(54) SYSTEMS AND METHODS FOR MINIMIZING PHASE DEVIATION AND/OR AMPLITUDE MODULATION (AM)-TO-PHASE MODULATION (PM) CONVERSION FOR DYNAMIC RANGE, RADIO FREQUENCY (RF) NON-LINEAR AMPLIFIERS

(75) Inventors: Yunseo Park, Norcross, GA (US); Wangmyong Woo, Cumming, GA (US); Jaejoon Kim, Seoul (KR); Chang-Ho Lee, Marietta, GA (US)

(73) Assignee: Samsung Electro-Mechanics, Gyunngi-Do (KR)

( * ) Notice: Subject to any disclaimer, the term of this patent is extended or adjusted under 35 U.S.C. 154(b) by 156 days.

(21) Appl. No.: 13/104,838

(22) Filed: May 10, 2011

(65) Prior Publication Data

US 2012/0286860 A1    Nov. 15, 2012

(51) Int. Cl.
*G06G 7/26* (2006.01)

(52) U.S. Cl.
USPC ........................................... 327/560; 327/403

(58) Field of Classification Search
USPC .................. 327/403, 404, 560, 561, 562, 563
See application file for complete search history.

(56) References Cited

U.S. PATENT DOCUMENTS 5,061,865 A * 10/1991 Durst ............................. 327/336

* cited by examiner

*Primary Examiner* — Jeffrey Zweizig (57) ABSTRACT

Embodiments of the invention may provide systems and methods for minimizing phase deviation and/or amplitude modulation (AM)-to-phase modulation (PM) conversion for dynamic range, radio frequency (RF) non-linear amplifiers. In order to provide high dynamic range with reduced phase error, embodiments of the invention may utilize two separate paths for processing a signal. In particular, an input signal may be sampled and divided into each path. The first signal path may be used to shape a signal, and in particular, a voltage waveform at the load. The second signal path may be used for generating negative capacitances corresponding to the voltage waveform at the load. By combining the two signals at the load, a high-dynamic range, high-frequency, non-linear amplifier can be achieved that reduces phase error resulting from amplitude fluctuations with a relatively low unity-gain frequency ($f_T$) process.

20 Claims, 7 Drawing Sheets

SYSTEMS AND METHODS FOR MINIMIZING PHASE DEVIATION AND/OR AMPLITUDE MODULATION (AM)-TO-PHASE MODULATION (PM) CONVERSION FOR DYNAMIC RANGE, RADIO FREQUENCY (RF) NON-LINEAR AMPLIFIERS

FIELD OF THE INVENTION

Embodiments of the invention relate generally to non-linear amplifiers, and more particularly, to systems and methods for minimizing phase deviation and/or amplitude modulation (AM)-to-phase modulation (PM) conversion for dynamic range, radio frequency (RF) non-linear amplifiers.

BACKGROUND OF THE INVENTION

Because of large AM-to-PM conversion or other phase deviation present in a non-linear amplifier, such as a limiting amplifier, a non-linear amplifier typically generates phase error caused from amplitude fluctuations. The amount of AM-to-PM conversion may be a critical factor when the non-linear amplifier is being used to detect phase information of the input signal by limiting the amplitude and to pass through to a phase detector.

The phase errors or phase deviations are related to harmonic distortions in a non-linear amplifier. Indeed, high-order harmonics are generated by the non-linear amplifier during strong non-linear operation like limiting action, and these high-order harmonics affect the phase deviation of the total waveform output by the non-linear amplifier. Typically, it is the phase deviation of the fundamental frequency that dominates the total phase deviation; however, the second and third harmonic can likewise cause significant degradation to phase deviation when the circuit is designed improperly or suboptimally. While phase distortion from harmonic distortions comes from the intrinsic nature of the non-ideal active device, the bandwidth limitation of the non-linear amplifier also generates zero crossing delay variations—that is, AM-to-PM conversion.

A bias-dependent, non-linear characteristic of a transistor, for example, used in a non-linear amplifier can generate phase deviation as well. One example is the bias dependence of the input capacitance of bipolar transistors. If the bias current is restricted, as in the case with mobile applications, slewing limitation may impose a significant contribution to phase deviation.

Accordingly, there is an opportunity in the industry for systems and methods for minimizing phase deviation and/or AM-to-PM conversion for dynamic range, radio frequency (RF) non-linear amplifiers.

SUMMARY OF THE INVENTION

Some or all of the above needs and/or problems may be addressed by certain embodiments of the invention.

According to an example embodiment of the invention, there is a low phase distortion system. The system may include a first signal path that includes at least a first transconductance stage for receiving and amplifying an input signal and generating a first current output signal for shaping a voltage waveform at a load. The system may also include a second signal path parallel to the first signal path, where the second signal path includes at least a second transconductance stage and a third transconductance stage, where the second transconductance stage receives and amplifies the input signal and generates a linearly scaled signal, where the third transconductance stage receives the linearly scaled signal and generates a second current output signal, where the first current output signal and the second current output signal are delivered to the load, and where the second transconductance stage operates with the shaped voltage waveform at the load to generate a negative capacitance that is responsive to an amplitude of the input signal.

According to another example embodiment, there is a system for low phase distortion. The system may include a first signal path that includes at least a first transconductance stage and a second transconductance stage, where the first transconductance stage receives an input radio frequency (RF) signal and generates a linearly scaled signal, and where the second transconductance stage receives the linearly scaled signal and generates a first current output signal. The system may also include a second signal path parallel to the first signal path, where the second signal path samples the input RF signal and supports a voltage waveform at the load, where the voltage waveform enables the second transconductance stage to generate a negative capacitance.

BRIEF DESCRIPTION OF THE DRAWING

Having thus described the invention in general terms, reference will now be made to the accompanying drawings, which are not necessarily drawn to scale, and wherein:

DETAILED DESCRIPTION OF THE INVENTION

Example embodiments of the invention now will be described more fully hereinafter with reference to the accompanying drawings, in which some, but not all embodiments of the invention are shown. Indeed, these inventions may be embodied in many different forms and should not be construed as limited to the embodiments set forth herein; rather, these embodiments are provided so that this disclosure will satisfy applicable legal requirements. Like numbers refer to like elements throughout.

Embodiments of the invention may provide systems and methods for minimizing phase deviation and/or amplitude modulation (AM)-to-phase modulation (PM) conversion for dynamic range, radio frequency (RF) non-linear amplifiers. In order to provide high dynamic range with reduced phase error, embodiments of the invention may utilize two separate paths for processing a signal. In particular, an input signal may be sampled and divided into each path. The first signal path may be used to shape a signal, and in particular, a voltage waveform at the load. The second signal path may be used for generating negative capacitances corresponding to the voltage waveform at the load. By combining the two signals at the load, a high-dynamic range, high-frequency, non-linear amplifier can be achieved that reduces phase error resulting from amplitude fluctuations with a relatively low unity-gain frequency ($f_T$) process.

Aspects of the invention may provide systems, methods, and amplifiers that obtain low phase deviation for non-constant amplitude input signal over high dynamic range. Indeed, there may be a simultaneous improvement on dynamic range and phase deviation. Aspects of the invention may provide systems, methods, and amplifiers that can operate with low current consumption in order to facilitate their use with mobile applications. Other aspects of the invention may include systems, methods, and amplifiers that use low $f_T$ process to accomplish any of the tasks described herein.

Figure 1:
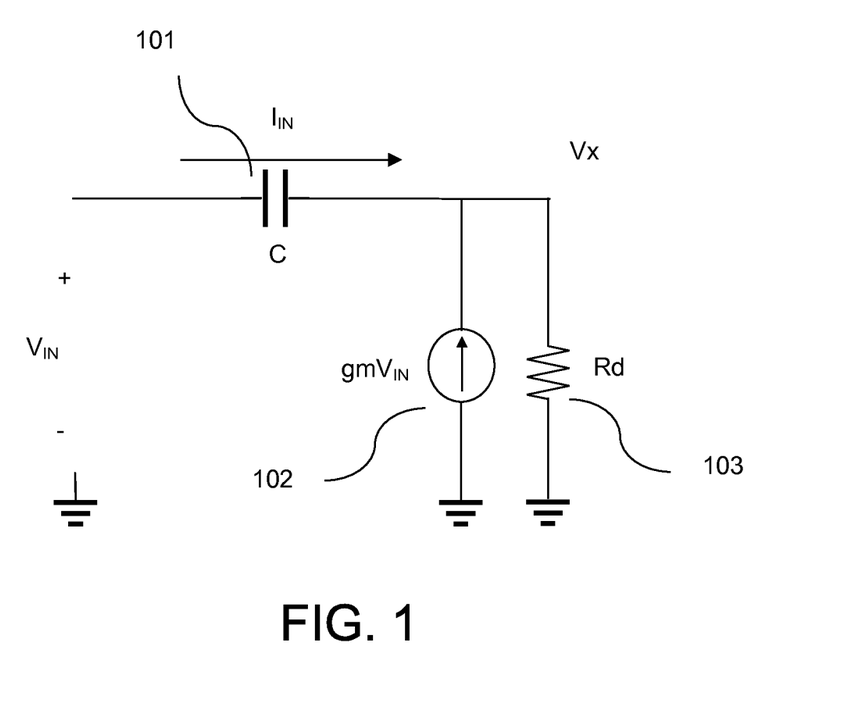
FIG. 1 is a schematic diagram illustrating negative capacitance generation in accordance with an example embodiment of the invention.

FIG. 1 is a schematic diagram illustrating negative capacitance generation in accordance with an example embodiment of the invention. As will be described in detail herein, one signal path may be utilized for generating negative capacitance that is responsive to an input voltage. The following explanation prior to the discussion of FIG. 1 provides an explanation of why the generation of negative capacitance, especially for large input signals, can have an effect of reducing phase deviation in a limiting amplifier, according to an example embodiment of the invention.

As will be explained herein, the generation of a negative capacitance has its basis in the operation of an RC network in operation with a transconductance stage. For high input amplitude signal, a large signal delay ($\delta dh$) due to the RC network may be calculated as follows: $\delta dh = \tau \cdot \ln 2 = RC \cdot \ln 2$, where $\tau = R \cdot C$, R is the resistance value in the RC network, and C is the capacitance value for the RC network. For a small input amplitude signal, of which gain is too small to cause limiting action at the output, a small signal delay $\delta ds = RC$, which is related to 3 dB bandwidth of RC network.

The worst case phase deviation comes from the difference of output delay between small input signal amplitude and large input signal amplitude before limiting action takes place. Therefore, the maximum delay $\delta d = \delta ds - \delta dh = RC - RC \cdot \ln 2 = RC \cdot (1 - \ln 2)$, which can be translated into a maximum phase deviation ($\delta \phi$) using the following equation (1):

$$\delta \phi = f_{in} * 360 * \delta d \quad (1)$$
$$= f_{in} * 360 * RC * (1 - \ln 2)$$
$$= f_{in} * 360 * (1 - \ln 2) / (2 * \pi * f_{3dB})$$
$$= (f_{in} / f_{3dB}) * 17.58 \text{ degrees}$$

Generally, $f_{in}/f_{3dB}$ is close to 1 in a commercial application due to the exponentially increased cost of process, which leads to a maximum phase deviation of 17.58 degrees.

Suppose that the large signal delay ($\delta dh$) of $R_r C_r$ is for a large signal input and the small signal delay (ads) of $R_s C_s$ is for small signal input, the delay ($\Delta d$) can be calculated as in equation (2):

$$\Delta d = R_s C_s - R_r C_r * \ln 2 \quad (2)$$

If the small signal resistance $R_s$ reduces as input amplitude decreases and the large signal resistance $R_r$ increases as input amplitude increases, then the delay ($\Delta d$) can be reduced; however, this approach can change the gain of the limiting stages. On the other hand, if the small signal capacitance $C_s$ reduces as the input amplitude decreases and the large signal capacitance $C_r$ increases as input amplitude increases, then the delay ($\Delta d$) can be reduced. In particular, the reduction of the small signal capacitance $C_s$ as the input amplitude decreases may have the effect of minimizing the small signal delay component ($R_s C_s$) of the delay ($\Delta d$). Likewise, the increase of the large signal capacitance $C_r$ as the input amplitude increases tends to increase the value of $R_r C_r * \ln 2$, which is being subtracted in the delay ($\Delta d$) calculation. It will be appreciated that as long as the small signal capacitance $C_s$ change does not degrade the bandwidth of the example limiting amplifier, the change of the small signal capacitance $C_s$ proportional to the input amplitude can reduce phase deviations over a large dynamic range of input signals.

FIG. 1 is a schematic diagram illustrating negative capacitance generation in accordance with an example embodiment of the invention. As will be described in detail herein, the schematic diagram of FIG. 1 may be representative of the operation of a transconductance (gm) stage configured with a capacitor (e.g., a bias-dependent capacitor) for generating a negative capacitance. It will be appreciated that the generation of the negative capacitance can be used to cancel out a parasitic capacitance, thereby resulting in a decrease in the total capacitance that includes the parasitic capacitance and the negative capacitance. The decrease in the total capacitance can result in a reduction of delay and the associated phase deviation, according to an example embodiment of the invention.

Turning now to FIG. 1, there is illustrated an RC network having a capacitor 101 (C) and an resistor 103 (Rd), which may be representative of a load resistance. In FIG. 1, there is a voltage difference across the capacitor 101 corresponding to a difference between the input signal voltage ($V_{IN}$) and the load voltage ($V_x$) of the load resistor 103 (Rd). Accordingly, there may be a current ($I_{IN}$) across the capacitor 101. In addition, there may be a transconductance (gm) stage 102 that is represented as a input voltage ($V_{IN}$) dependent current source with magnitude of $gmV_{IN}$. From FIG. 1, then input impedance ($Z_{IN}$) can be defined as follows: $Z_{IN} = V_{IN}/I_{IN} = (1/sC + Rd)/(1 - gmRd) = 1/(sC*(1 - gmRd)) + Rd/(1 - gmRd)$. It will be appreciated that the term $sC*(1 - gmRd)$ is the effective capacitance seen from the input and is decreased by the ratio of approximately $V_x$ and $V_{IN}$. If K is defined as $V_x/V_{IN}$ and bigger than 1, then the effective capacitance ($C*(1-K)$) seen from the input turns into the negative value. Indeed, when $V_x > V_{IN}$, the value of K will be greater than 1, and the input capacitance will be negative. Likewise, when $V_x = V_{IN}$, then $K = 1$ and the effective capacitance ($C*(1-K)$) seen from the input is zero.

Based upon the foregoing, it will be appreciated that the voltage across the capacitor 101, which is determined based upon the $V_{IN}$ and $V_x$, dictates the value of the negative capacitance that is generated.

The important thing is that the voltage across the capacitor, C, actually determines the value of negative capacitance generated from the design. By fixing the value of the load voltage ($V_x$), the negative capacitance seen from the input increases as the input voltage $V_{IN}$ decreases. When this negative capacitance is used to cancel out a parasitic capacitance, the total capacitance, including the parasitic capacitance and the negative capacitance decreases as the input voltage ($V_{IN}$) decreases. This causes the same effect as if the total capacitance decreases as input voltage ($V_{IN}$) amplitude decreases.

As a result, phase deviation can be minimized to a certain degree, according to an example embodiment of the invention.

Accordingly, the effective minimization of phase deviation can be achieved through the control of the load voltage ($V_x$), which enables $C*(1-k)$ to effectively track the rate at which delay changes depend on the input signal slope (or input amplitude). Suppose capacitor 101 (C) in the RC network contains bias-dependent capacitance, which is the case when the transconductance stage 102 is provided by a transistor such as a bipolar transistor or a field-effect transistor (FET) such as a MOS transistor. For example, the capacitor 101 (C) can be a bias-dependent capacitance where it is the base capacitance of a bipolar transistor or the source/drain-to-substrate capacitance of a MOS transistor. Accordingly, with the use of a bias-dependent capacitance for capacitor 101 (C), the load voltage ($V_x$) can control the potential difference over the capacitor 101 (C), which also controls the value of negative capacitance. By controlling the load voltage ($V_x$) to have a proper value, delay can be minimized.

Figure 2:
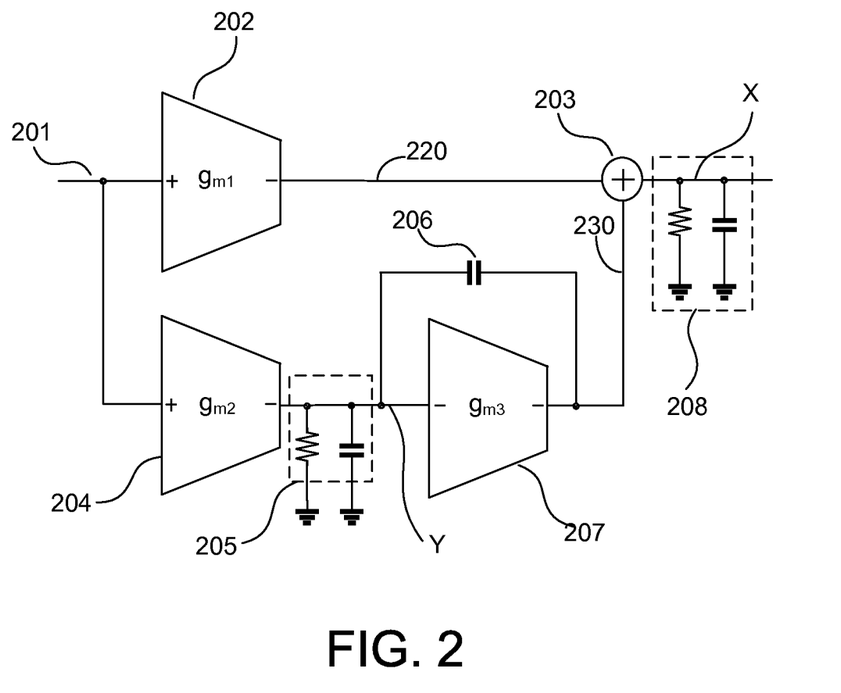
FIG. 2 illustrates a schematic diagram of an example limiting amplifier in accordance with an example embodiment of the invention.

FIG. 2 illustrates a schematic diagram of an example limiting amplifier in accordance with an example embodiment of the invention. As shown in FIG. 2, the example limiting amplifier can include transconductance stages 202, 204, 207, and a combiner or adder 203. In FIG. 2, an example input signal 201 may be divided into two signal paths, where the first signal path includes a high-impedance transconductance stage 202, and the second signal path includes a high-impedance transconductance stage 204 and transconductance stage 207. It will be appreciated that the transconductance stage 207 and the capacitor/capacitance 206 can be used to generate negative capacitance in a manner similarly described with respect to FIG. 1 above.

Returning now to FIG. 2, in the first signal path, the high-impedance transconductance stage 202 can amplify the input signal 201 and generate a first current output signal 220, which is added by combiner or adder 203 to a second current output signal 230 from transconductance stage 207 and capacitor/capacitance 206 of the second signal path. The output of the combiner or adder 203 at node X is delivered to a load 208 comprising resistance and capacitance. It will be appreciated that the load 208 resistance and capacitance may be shared by both transconductance stages 202 and 207 in the respective first and second signal paths through the combiner or adder 203. The waveform at node X in FIG. 2 may be limited by the supply voltage and load 208 resistance.

In operation, the first signal path, and in particular, the transconductance stage 202, may shape the waveform (e.g., voltage) at the node X in order for negative capacitance generated by the transconductance stage 207 and capacitor/capacitance 206 of the second signal path to have a proper value to minimize phase variation subject to the input amplitude variation of the input signal 201.

Still referring to FIG. 2, the load 205 resistance and capacitance may be that for the transconductance stage 204. In particular, load 205 capacitance may represent an effective capacitance seen at the output of the transconductance stage 204, excluding any negative capacitance generated by the transconductance stage 207 and capacitor/capacitance 206 The waveform of the input signal 201 may be amplified through the transconductance stage 204 and the load 205, and thus, at node Y (also the input to the transconductance stage 207), the amplified waveform still has an original waveform shape with scaled amplitude.

Meanwhile, the waveform at node X is limited by the supply voltage and load 208 resistance. The voltage at node X is greater than the voltage at node Y, and the voltage difference between node X and node Y is proportional to the input amplitude of the input signal 201. The negative resistance, and thus, the negative capacitance, generated from the capacitor/capacitance 206 and the transconductance stage 207 is proportional to the voltage difference between nodes X and Y, which leads to the effective capacitance cancellation in accordance with the input amplitude variation of the input signal 201. Thus, when the input amplitude of the input signal 201 is small, the amount of negative capacitance generated from the capacitor/capacitance 206 and the transconductance stage 207 is proportionally small. On the other hand, when the input amplitude of the input signal 201 is proportionally large, the amount of negative capacitance generated from the capacitor/capacitance 206 and the transconductance stage 207 is large. Accordingly, the role of the transconductance stage 202 (gm1) is to set up a proper waveform (e.g., voltage) at node X so that the negative capacitance generated from capacitor/capacitance 206 and transconductance stage 207 (gm3) is proportional to the waveform at node Y.

It will be appreciated that the voltage difference between nodes X and Y, which is proportional to the input amplitude of the input signal 201, is likewise the voltage across capacitor/capacitance 206 and transconductance stage 207. This voltage across capacitor/capacitance 206 can facilitate the generation of a voltage-controlled negative capacitance. For example, capacitor/capacitance 206 may be a bias-dependent capacitance where the transconductance stage 207 is a bipolar transistor or MOS transistor, and the capacitor/capacitance 206 is either the base capacitance of a bipolar transistor or the source/drain-to-substrate capacitance of a MOS transistor. Therefore, the value of the capacitor/capacitance 206 tends to increase as the voltage across the capacitor/capacitance 206 increases, thereby generating an appropriate negative capacitance, as similarly described with respect to the RC network of FIG. 1, for reducing a total capacitance (e.g., including parasitic capacitances) attributable to transconductance stage 204 and load 205.

Figure 3:
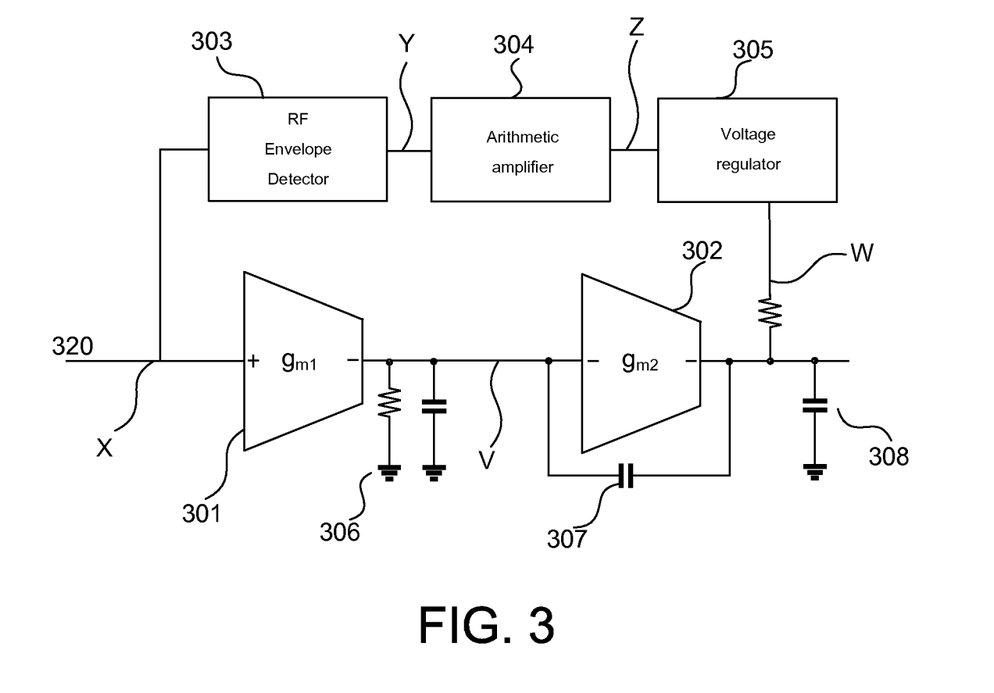
FIG. 3 illustrates another example limiting amplifier for use with radio frequency (RF) carrier modulated waveforms, according to an example embodiment of the invention.

FIG. 3 illustrates another example limiting amplifier for use with radio frequency (RF) carrier modulated waveforms, according to an example embodiment of the invention. In FIG. 3, there is a first signal path comprising an RF envelope detector 303, an arithmetic amplifier 304, and a voltage regulator 305. The second signal path comprises transconductance stages 301, 302 and capacitor/capacitance 307. Both the first and second signal paths may receive the input signal 320 at node X associated with the input signal 320, and may likewise be connected at the output to a load 308 comprising a resistance and capacitance.

During operation, the first signal path may operate to shape the waveform at node W in order for the negative capacitance generated by the transconductance stage 302 and the capacitor/capacitance 307 of the second signal path to have a proper value to minimize phase variation subject to the input amplitude variation of the input signal 320. To do so, the input signal 320 at node X is sampled through the envelope detector 303 to distinguish the envelope information from its carrier signal. The extracted envelope signal at node Y is received by the arithmetic amplifier 304, which manipulates the extracted envelope signal to generate a manipulated signal that serves as the basis for properly setting the limited amplitude at W at the load 308. In other words, the arithmetic amplifier 304 may be configured to process the envelope signal at node Y and to support the setting of the voltage at node W, which enables the generation of a voltage-controlled negative capacitance by transconductance stage 302 and capacitor/capacitance 307, which may cancel the amplitude dependent delay caused from transconductance stage 301 and load 306. In an example embodiment, depending on needs, the arithmetic amplifier 304 may be a linear amplifier, a log amplifier or an exponential amplifier. The voltage regulator 305 can receive the manipulated signal at node Z from the arithmetic amplifier 304, and can generate a stable output voltage at node W, which is in linear proportion to the signal at node Z.

In the second signal path, the waveform of the input signal 320 may be amplified through the transconductance stage 301 and the load 306, and thus, at node V (also the input to the transconductance stage 302), the amplified waveform still has an original waveform shape with scaled amplitude. By adjusting the supply voltage to transconductance stage 302, the limited amplitude at the load of transconductance stage 302 can be controlled to a proper value so that the linear amplitude at node V and the limited amplitude at node W constitutes a voltage difference which depends on the input amplitude of the input signal 320 at the node X. The voltage difference between node W and node V may control the generated negative capacitance by transconductance stage 302 and capacitor/capacitance 307 in accordance with the input amplitude variation of the input signal 320 at node X. Indeed, transconductance stage 302 and the capacitor/capacitance 307 can generate a required negative capacitance to cancel out the capacitance at load 306 of transconductance stage 301.

In FIG. 3, the load 306 capacitance may represent an effective capacitance seen at the output of the transconductance stage 301, excluding any negative capacitance generated by the transconductance stage 302 and the capacitor/capacitance 307. For example, the load 306 capacitance can include load capacitance and any parasitic voltage-controlled capacitance such as a depletion capacitance at a pn junction of the transconductance stage 301. Because the delay comes from the slope of the input signal at the zero crossing point and input amplitude dependent capacitance, more precise cancellation can be done by adjusting voltage difference between nodes V and W.

It will be appreciated that the voltage difference between nodes V and W, which is proportional to the input amplitude of input signal 320 at node X, is likewise the voltage across capacitor/capacitance 307 and transconductance stage 302. This voltage across capacitor/capacitance 307 can facilitate the generation of a voltage-controlled negative capacitance. For example, capacitor/capacitance 307 may be a bias-dependent capacitance where the transconductance stage 302 is a bipolar transistor or MOS transistor, and the capacitor/capacitance 307 is either the base capacitance of a bipolar transistor or the source/drain-to-substrate capacitance of a MOS transistor. Therefore, the value of the capacitor/capacitance 307 tends to increase as the voltage across the capacitor/capacitance 307 increases, thereby generating an appropriate negative capacitance, as similarly described with respect to the RC network of FIG. 1, for reducing a total capacitance (e.g., including parasitic capacitances) attributable to transconductance stage 301 and load 306.

Figure 4:
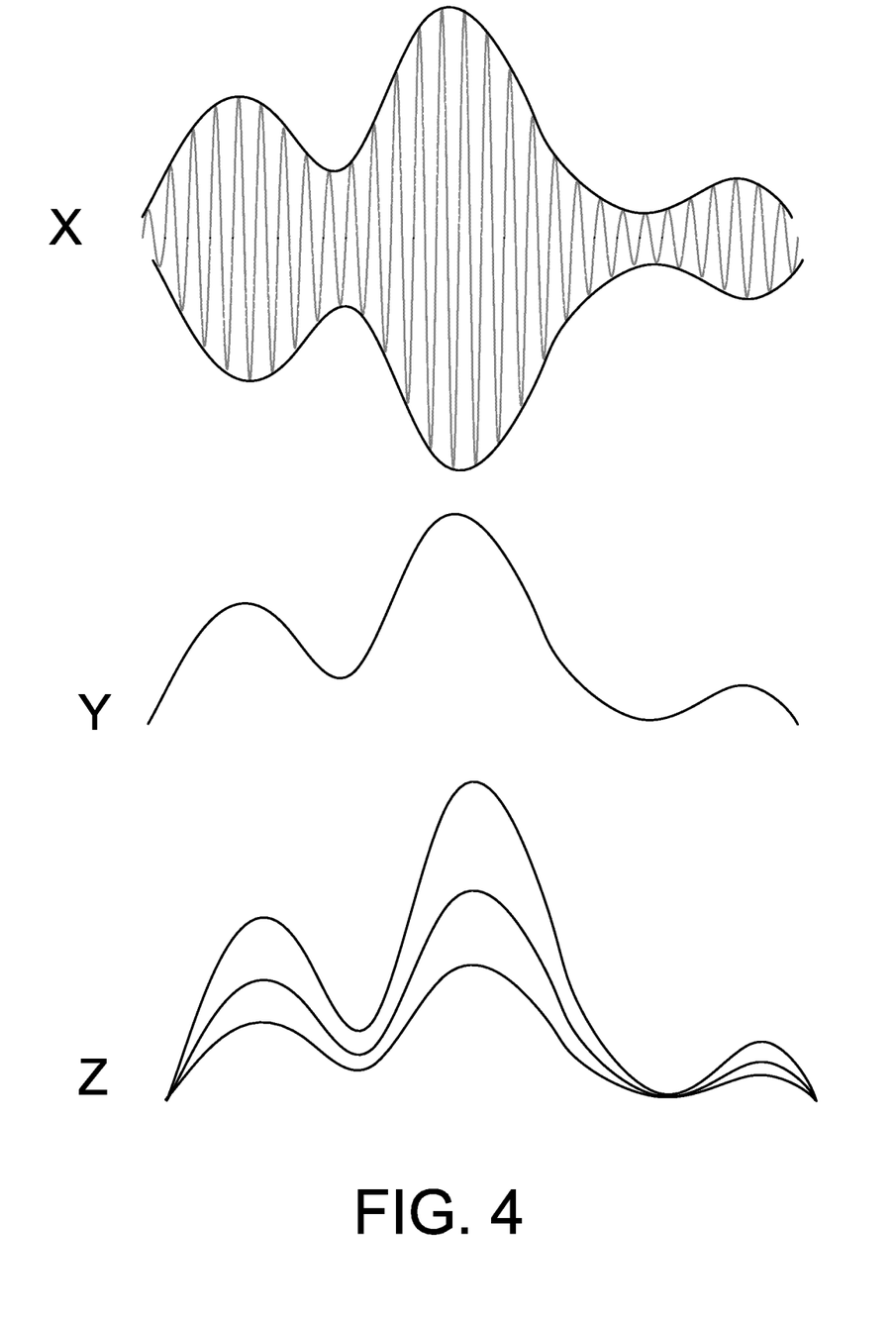
FIG. 4 illustrates the waveforms at nodes X,Y and Z described in FIG. 3, according to an example embodiment of the invention.

FIG. 4 illustrates the waveforms at nodes X,Y and Z described in FIG. 3, according to an example embodiment of the invention. The waveform at node X may represent an RF modulated waveform. The waveform at node Y may represent an envelope detected waveform. The waveform at node Z may represent an amplitude adjusted waveform of node Y to properly generate negative capacitance value from transconductance stage 302 and capacitor/capacitance 307 in FIG. 3, according to an example embodiment of the invention.

Figure 5:
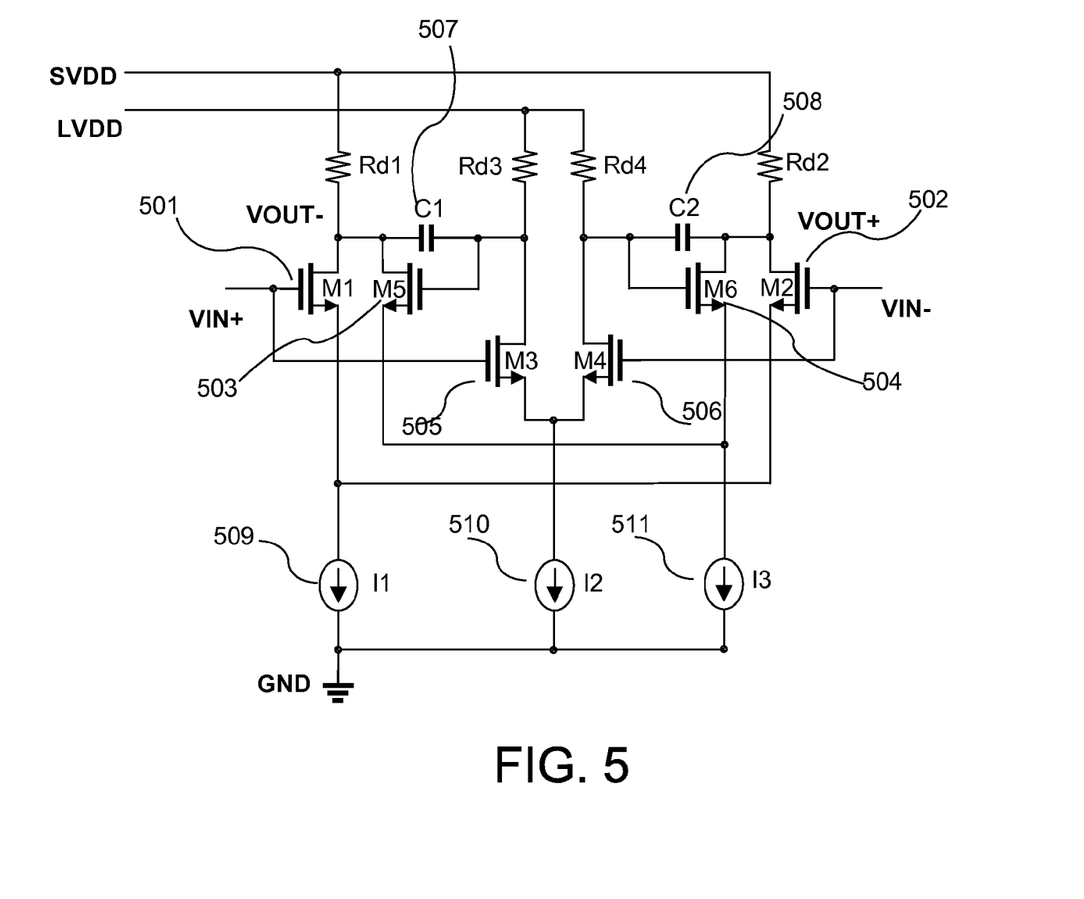
FIG. 5 illustrates an example limiting amplifier that is implemented as a differential circuit, according to an example embodiment of the invention.

FIG. 5 illustrates an example limiting amplifier that is implemented as a differential circuit, according to an example embodiment of the invention. The schematic of FIG. 5 may be an example differential circuit schematic corresponding to the limiting amplifier of FIG. 2. For example, the MOS transistors 501 (M1) and 502 (M2) in FIG. 5 may correspond to the transconductance stage 202 (gm1) in FIG. 2. The MOS transistors 505 (M3) and 506 (M4) in FIG. 5 may correspond to the transconductance stage 204 (gm2) in FIG. 2. The MOS transistors 503 (M5) and 504 (M6) in FIG. 5 may correspond to the transconductance stage 207 (gm3) in FIG. 2. The capacitors 507 (C1) and 508 (C2) in FIG. 5 may correspond to the capacitor/capacitance 206 in FIG. 2.

The gates of the MOS transistors 501, 505 may receive the positive differential input signal (VIN+) while the gates of the MOS transistors 502, 506 may receive the negative differential input signal (VIN−). The outputs at the drains of MOS transistors 501, 502 may be delivered to respective load resistors Rd1, Rd2. On the other hand, the outputs at the drains of MOS transistors 505, 506 may be delivered to the respective gates of MOS transistors 503, 504 and capacitors 507, 508. The respective drains of the MOS transistors 503, 504 and respective capacitors 507, 508 may be connected to the respective load resistors Rd1, Rd2.

Still referring to FIG. 5, the DC supply voltage SVDD can be provided via load resistors Rd1, Rd2, to the respective drains of MOS transistors 501, 502. Likewise, the DC supply voltage LVDD can be provided via load resistors Rd3, Rd4 to respective drains of transistors 505, 506. Likewise, current sources 509, 510, and 511 are illustrated to show transconductance sources for one or more of the transistors 501-506.

Figure 6:
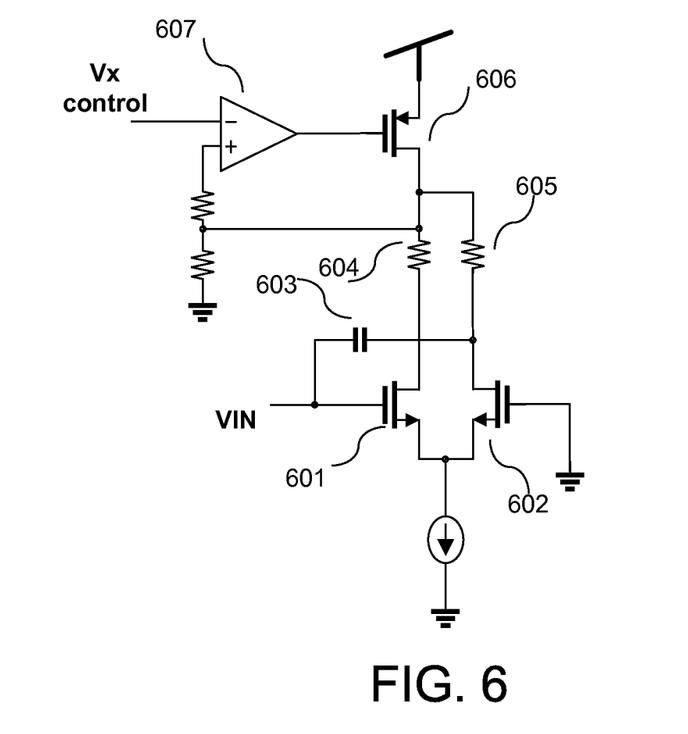
FIG. 6 illustrates an example single-ended circuit schematic for a voltage regulator and a transconductance stage and capacitor/capacitance for generating a negative capacitance, according to an example embodiment of the invention.

FIG. 6 illustrates an example single-ended circuit schematic for a voltage regulator and a transconductance stage and capacitor/capacitance for generating a negative capacitance, according to an example embodiment of the invention. As an example, the MOS transistors 601, 602 can correspond to the transconductance stage 302 in FIG. 3, and the input voltage $V_{IN}$ may be received at the gate of MOS transistor 601. Load resistors 604, 605 may correspond to the load 308 resistance in FIG. 3. The capacitor 603 can correspond to capacitor/capacitance 307 in FIG. 3. Likewise, operational amplifier 607 and the MOS transistor 606 may correspond to the voltage regulator 305 in FIG. 3. The amplifier 607 may receive a control signal at its negative input port from an arithmetic amplifier. The positive input port of the amplifier 607 may be connected to the drains of MOS transistors 601, 602 via the load resistors 604, 605. The output of the amplifier 607 may be delivered to the load resistors 604, 605 via MOS transistor 606.

Figure 7:
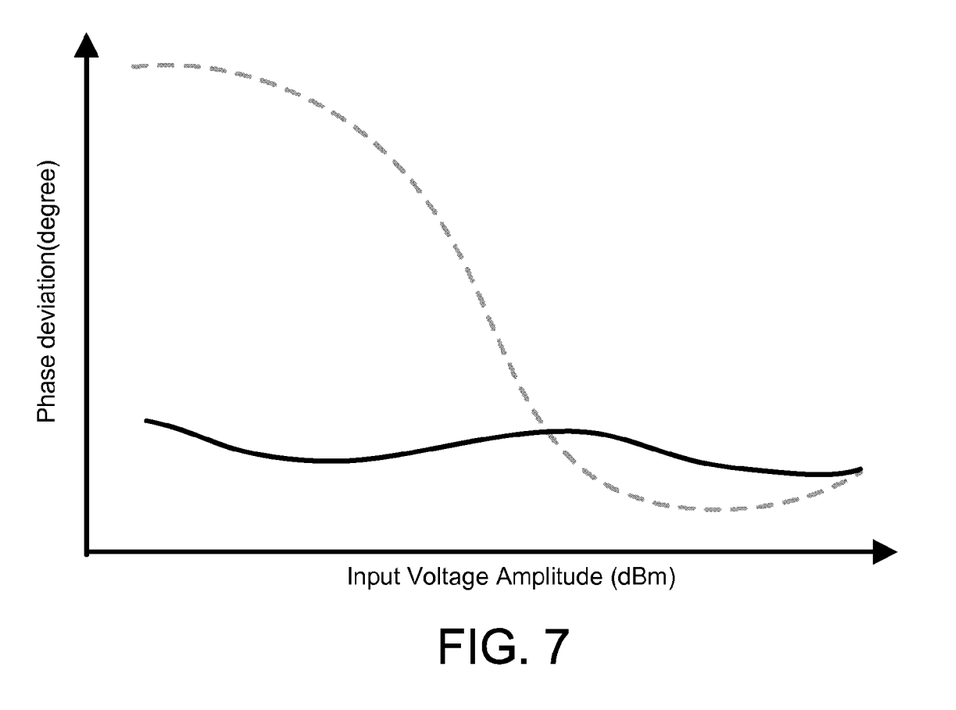
FIG. 7 illustrates a comparison in phase deviation between an example limiting amplifier and a conventional limiting amplifier design, where both designs have the same gain and bandwidth, according to an example embodiment of the invention.

FIG. 7 illustrates simulated results from an example differential circuit schematic of the example limiting amplifier of FIG. 5 and a conventional limiting amplifier on the condition of the same gain and bandwidth. The results from the invention are shown as a solid line while the one from a conventional limiting amplifier is shown in a dashed line. As shown in FIG. 7, the phase deviation for the example differential limiting amplifier in accordance with an example embodiment has significantly lower phase deviation than that for a conventional limiting amplifier, according to an example embodiment of the invention.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not limited to the specific embodiments disclosed and that modifications and other embodiments are intended to be included within the scope of the appended claims. Although specific terms are employed herein, they are used in a generic and descriptive sense only and not for purposes of limitation.

What is claimed is:

1. A low phase distortion system, comprising:
    a first signal path that includes at least a first transconductance stage for receiving and amplifying an input signal and generating a first current output signal for shaping a voltage waveform at a load; and
    a second signal path parallel to the first signal path, wherein the second signal path includes at least a second transconductance stage and a third transconductance stage, wherein the second transconductance stage receives and amplifies the input signal and generates a linearly scaled signal, and wherein the third transconductance stage receives the linearly scaled signal and generates a second current output signal,
    wherein the first current output signal and the second current output signal are delivered to the load, wherein the third transconductance stage operates with the shaped voltage waveform at the load to generate a negative capacitance that is responsive to an amplitude of the input signal.

2. The system of claim 1, wherein the negative capacitance cancels at least a portion of the parasitic capacitance or load capacitance generated by the second transconductance stage.

3. The system of claim 1, wherein a magnitude of the negative capacitance is based at least in part on a voltage difference between (i) a first voltage provided to the load by the shaped voltage waveform, and (ii) a second voltage associated with the linearly scaled signal.

4. The system of claim 3, wherein the voltage difference is proportional to the amplitude of the input signal.

5. The system of claim 1, wherein the load includes resistance and capacitance.

6. The system of claim 1, wherein each of the first, second, and third transconductance stages includes one or more transistors.

7. The system of claim 1, further comprising a parallel capacitor or capacitance that is arranged in parallel with the third transconductance stage to support the generation of the negative capacitance.

8. The system of claim 1, wherein the third transconductance stage includes either a field effect transistor (FET) or a bipolar junction transistor (BJT), and wherein the parallel capacitor or capacitance is either (i) a source-to-substrate or drain-to-substrate capacitance of the FET, or (ii) a base capacitance of the BJT.

9. The system of claim 1, further comprising:
    an adder or combiner that combines the first current output signal and the second output signal to provide a combined signal that is delivered to the load.

10. The system of claim 1, wherein the voltage waveform at the load is limited by supply voltage of the third transconductance stage and a resistance of the load.

11. A system for low phase distortion, comprising:
    a first signal path that includes at least a first transconductance stage and a second transconductance stage, wherein the first transconductance stage receives an input radio frequency (RF) signal and generates a linearly scaled signal, and wherein the second transconductance stage receives the linearly scaled signal and generates a first current output signal;
    a second signal path parallel to the first signal path, wherein the second signal path samples the input RF signal and supports a voltage waveform at the load,
    wherein the voltage waveform enables the second transconductance stage to generate a negative capacitance.

12. The system of claim 11, wherein a magnitude of the negative capacitance is based at least in part on a voltage difference between (i) a first voltage associated with the voltage waveform, and (ii) a second voltage associated with the linearly scaled signal.

13. The system of claim 12, wherein the voltage difference is proportional to the input voltage of the input RF signal.

14. The system of claim 11, wherein the second signal path includes at least an RF envelope detector, an arithmetic amplifier, and a voltage regulator.

15. The system of claim 14, wherein the RF envelope detector removes a carrier signal from the input RF signal to generate an envelope signal, wherein the arithmetic amplifier provides gain to the generated envelope signal to provide a processed signal, and wherein the voltage regulator applies the processed signal to the load to support the voltage waveform at the load.

16. The system of claim 11, wherein the negative capacitance cancels at least a portion of one or both of the parasitic capacitance or load capacitance associated with the first transconductance stage.

17. The system of claim 11, wherein the load includes impedance and capacitance.

18. The system of claim 11, wherein each of the first and second transconductance stages includes one or more transistors.

19. The system of claim 18, wherein the second transconductance stage includes either a field effect transistor (FET) or a bipolar junction transistor (BJT), and wherein the negative capacitance is based at least in part upon either (i) a source-to-substrate or drain-to-substrate capacitance of the FET, or (ii) a base capacitance of the BJT.

20. The system of claim 11, wherein the voltage waveform at the load is limited by supply voltage of the second transconductance stage and the resistance of the load.

* * * * *